United States Patent
Tu

(10) Patent No.: US 11,156,826 B2
(45) Date of Patent: Oct. 26, 2021

(54) OPTICAL DEVICES

(71) Applicant: VisEra Technologies Company Limited, Hsin-Chu (TW)

(72) Inventor: Zong-Ru Tu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 196 days.

(21) Appl. No.: 16/710,584

(22) Filed: Dec. 11, 2019

(65) Prior Publication Data

US 2021/0181497 A1    Jun. 17, 2021

(51) Int. Cl.
| | |
|---|---|
| *G02B 26/00* | (2006.01) |
| *G02B 5/20* | (2006.01) |
| *G02B 5/28* | (2006.01) |
| *G02B 7/00* | (2021.01) |

(52) U.S. Cl.
CPC ........... *G02B 26/008* (2013.01); *G02B 5/201* (2013.01); *G02B 5/285* (2013.01); *G02B 7/006* (2013.01)

(58) Field of Classification Search
CPC ...... G02B 26/008; G02B 5/201; G02B 5/285; G02B 7/006; G02B 5/204; G02B 27/0018; G02B 5/223; G02B 5/20; G02B 3/0056; G02F 1/133514; G02F 2201/52; G02F 1/13394; G02F 1/1339; G02F 1/134309; G02F 1/1341; G02F 1/13396; G02F 1/13398; G02F 1/0107
USPC ........................................................ 359/891
See application file for complete search history.

(56) References Cited

U.S. PATENT DOCUMENTS

| | | | |
|---|---|---|---|
| 2014/0339606 A1* | 11/2014 | Lin | ................... H01L 27/14621 257/228 |
| 2015/0303333 A1 | 10/2015 | Yu et al. | |
| 2016/0172390 A1* | 6/2016 | Numata | .............. H01L 27/1463 257/432 |

FOREIGN PATENT DOCUMENTS

| | | | | |
|---|---|---|---|---|
| CN | 101743433 A | 6/2010 | | |
| JP | 2009-238942 | 10/2009 | | |
| JP | 2009-266900 | 11/2009 | | |
| JP | 2020173417 A | * 10/2020 | ........... H04N 9/0455 |
| KR | 10-2009-0102696 | 9/2009 | | |
| TW | 201502660 A | 1/2015 | | |
| TW | 201743438 A | 12/2017 | | |
| WO | WO2005/101067 | 10/2005 | | |

* cited by examiner

*Primary Examiner* — Jade R Chwasz
(74) *Attorney, Agent, or Firm* — Muncy, Geissler, Olds & Lowe, P.C.

(57) ABSTRACT

An optical device is provided. The optical device includes a substrate, a central color filter, a first color filter and a second color filter sequentially disposed on the substrate from the center to the edge of the substrate, and a central hollow member, a first hollow member and a second hollow member respectively disposed on the central color filter, the first color filter and the second color filter. There is no distance between a center of the central color filter and a center of the central hollow member. There is a first distance between a center of the first color filter and a center of the first hollow member. There is a second distance between a center of the second color filter and a center of the second hollow member. The first distance is greater than zero. The second distance is greater than the first distance.

19 Claims, 9 Drawing Sheets

OPTICAL DEVICES

BACKGROUND OF THE INVENTION

Field of the Invention

The invention relates to an optical device, and more particularly to an optical device with hollow members disposed above color filters.

Description of the Related Art

In an optical device, for example, an image sensor device, while an incident light passes through a periodic structure, such as microlenses, in the image sensor device, unexpected ghost image and petal flare appear on a display panel due to worse surface diffraction.

Compared to an optical device with a composite metal grid (CMG)-type structure whose microlens is required above the color filters, it is currently known that an optical device with a wave guide color filter (WGCF)-type structure whose low-refractive-index material layer surrounding the color filters is used instead of the microlens to form a wave guide structure has its application advantages.

Therefore, development of an optical device with a wave guide color filter (WGCF)-type structure capable of effectively eliminating ghost image and petal flare is desirable.

BRIEF SUMMARY OF THE INVENTION

In accordance with one embodiment of the invention, an optical device is provided. The optical device includes a substrate, a central color filter, a first color filter and a second color filter sequentially disposed on the substrate from the center to the edge of the substrate, and a central hollow member, a first hollow member and a second hollow member respectively disposed on the central color filter, the first color filter and the second color filter. There is no distance between a center of the central color filter and a center of the central hollow member. There is a first distance between a center of the first color filter and a center of the first hollow member. There is a second distance between a center of the second color filter and a center of the second hollow member. The first distance is greater than zero. The second distance is greater than the first distance.

In some embodiments, each of the central hollow member, the first hollow member and the second hollow member includes a continuous wall structure enclosing a space. In some embodiments, the continuous wall structure has a taper cross section. In some embodiments, the continuous wall structure is in a shape of a rectangle, a circle or a triangle. In some embodiments, the optical device further includes a plurality of metal grids disposed on the substrate. In some embodiments, the continuous wall structure has a width which is less than one-third of a distance between the adjacent metal grids. In some embodiments, the continuous wall structure has a height which is in a range from about 0.1 µm to about 0.7 µm. In some embodiments, the space has a width which is less than one-third of a distance between the adjacent metal grids, while the continuous wall structure is in a shape of a rectangle. In some embodiments, the space has a diameter which is less than one-third of a distance between the adjacent metal grids, while the continuous wall structure is in a shape of a circle.

In some embodiments, the optical device further includes a low-refractive-index material layer covering the central color filter, the first color filter, the second color filter and the continuous wall structures of the central hollow member, the first hollow member and the second hollow member, and filled in the spaces of the central hollow member, the first hollow member and the second hollow member. In some embodiments, the low-refractive-index material layer has a refractive index which is in a range from about 1.2 to about 1.5. In some embodiments, the continuous wall structures of the central hollow member, the first hollow member and the second hollow member have a refractive index which is greater than that of the low-refractive-index material layer, and greater than those of the central color filter, the first color filter and the second color filter respectively underneath the continuous wall structures of the central hollow member, the first hollow member and the second hollow member. In some embodiments, the refractive index of the continuous wall structures of the central hollow member, the first hollow member and the second hollow member is in a range from about 1.6 to about 1.9.

In some embodiments, the optical device further includes a protection layer disposed between the central color filter, the first color filter and the second color filter and the central hollow member, the first hollow member and the second hollow member. In some embodiments, the optical device further includes a hard mask layer disposed on top of the continuous wall structures of the central hollow member, the first hollow member and the second hollow member.

In some embodiments, the substrate includes a central region, a first region and a second region sequentially from the center to the edge of the substrate. In some embodiments, there are a plurality of the central color filters configured with the central hollow members within the central region, there are a plurality of the first color filters configured with the first hollow members within the first region, and there are a plurality of the second color filters configured with the second hollow members within the second region. In some embodiments, the continuous wall structures of the central hollow members, the first hollow members and the second hollow members constitute a first periodic structure. In some embodiments, the spaces of the central hollow members, the first hollow members and the second hollow members constitute a second periodic structure.

In the present invention, there are two periodic structures (i.e. the first periodic structure constituted by the continuous wall structures and the second periodic structure constituted by the spaces filled with the low-refractive-index material layer) formed in the optical device. Since the complicated periodic structures are disposed in the path through which light passes, the surface diffraction in the specific directions (i.e. the zero-order diffraction and the positive and negative first-order diffraction) is thus reduced such that unexpected ghost image and petal flare on the display panel are effectively eliminated. In addition, the hollow waveguide member includes the continuous wall structure with high-refractive-index material and the low-refractive-index material layer enclosed by the continuous wall structure. While the light energy is transmitted through the continuous wall structure with high-refractive-index material, the leaky modes of the adjacent energy waves in the continuous wall structure couple to improve the light energy in the low-refractive-index material layer, effectively increasing the ability to trap the light energy and improving the QE spectrum (R/G/B pixels), for example, within the central region of the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
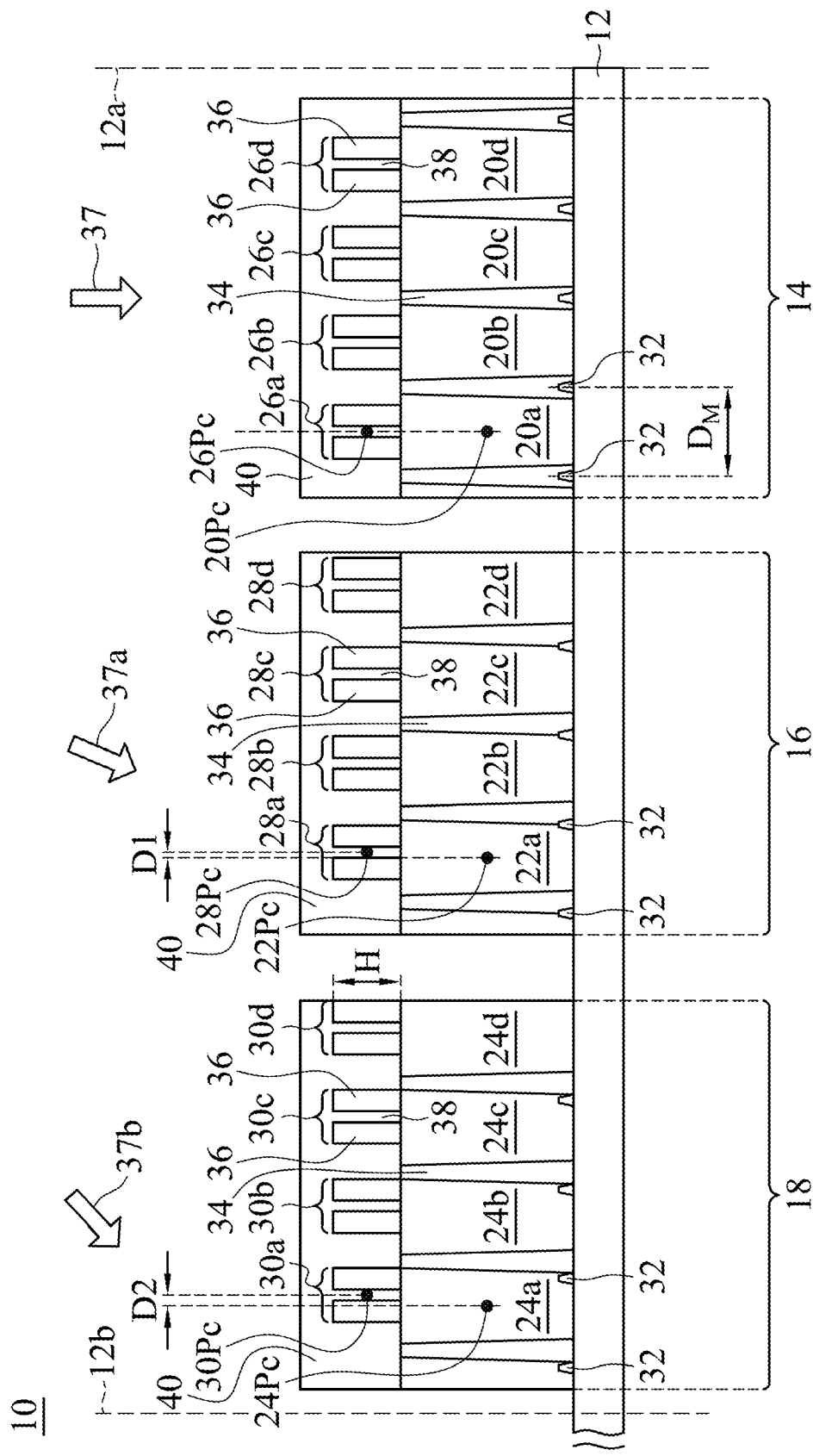
FIG. 1 is a cross-sectional view of an optical device in accordance with one embodiment of the invention.

Referring to FIG. 1, in accordance with one embodiment of the invention, an optical device 10 is provided. FIG. 1 is a cross-sectional view of the optical device 10.

In FIG. 1, the optical device 10 includes a substrate 12 which includes a central region 14, a first region 16 and a second region 18 sequentially from a center 12a towards an edge 12b of the substrate 12. The central region 14 contains a plurality of central color filters, for example 20a, 20b, 20c and 20d, disposed on the substrate 12. The first region 16 contains a plurality of first color filters, for example 22a, 22b, 22c and 22d, disposed on the substrate 12. The second region 18 contains a plurality of second color filters, for example 24a, 24b, 24c and 24d, disposed on the substrate 12. There are a plurality of central hollow members, for example 26a, 26b, 26c and 26d, respectively disposed on the central color filters (20a, 20b, 20c and 20d). There are a plurality of first hollow members, for example 28a, 28b, 28c and 28d, respectively disposed on the first color filters (22a, 22b, 22c and 22d). There are a plurality of second hollow members, for example 30a, 30b, 30c and 30d, respectively disposed on the second color filters (24a, 24b, 24c and 24d). Specifically, within the central region 14, the center point of the central hollow member overlaps with the center point of the underneath central color filter, for example, the center point 26Pc of the central hollow member 26a overlaps with the center point 20Pc of the central color filter 20a. That is, there is no distance between the center point of the central hollow member and the center point of the underneath central color filter. Within the first region 16, the center point of the first hollow member departs from the center point of the underneath first color filter by a specific distance, for example, the center point 28Pc of the first hollow member 28a departs from the center point 22Pc of the first color filter 22a by a first distance "D1", and the first distance "D1" is greater than zero. Within the second region 18, the center point of the second hollow member departs from the center point of the underneath second color filter by a specific distance, for example, the center point 30Pc of the second hollow member 30a departs from the center point 24Pc of the second color filter 24a by a second distance "D2". The second distance "D2" is greater than the first distance "D1". In detail, compared to the location of the central color filters (20a, 20b, 20c and 20d) within the central region 14, the first color filters (22a, 22b, 22c and 22d) within the first region 16 shift towards the center 12a of the substrate 12 by a specific distance. Also, the second color filters (24a, 24b, 24c and 24d) within the second region 18 shift towards the center 12a of the substrate 12 by a specific distance. The distance that the second color filters (24a, 24b, 24c and 24d) shift towards the center 12a of the substrate 12 is greater than the distance that first color filters (22a, 22b, 22c and 22d) shift towards the center 12a of the substrate 12. Compared to the location of the central hollow members (26a, 26b, 26c and 26d) within the central region 14, the first hollow members (28a, 28b, 28c and 28d) within the first region 16 shift towards the center 12a of the substrate 12 by a specific distance. Also, the second hollow members (30a, 30b, 30c and 30d) within the second region 18 shift towards the center 12a of the substrate 12 by a specific distance. The distance that the second hollow members (30a, 30b, 30c and 30d) shift towards the center 12a of the substrate 12 is greater than the distance that the first hollow members (28a, 28b, 28c and 28d) shift towards the center 12a of the substrate 12. Specifically, the shifting proportion between the first hollow members (28a, 28b, 28c and 28d) and the second hollow members (30a, 30b, 30c and 30d) towards the center 12a of the substrate 12 is greater than the shifting proportion between the first color filters (22a, 22b, 22c and 22d) and the second color filters (24a, 24b, 24c and 24d) towards the center 12a of the substrate 12. In addition, the color filters and the hollow members shift in the opposite direction to the incident light. For example, when the incident light 37a emits from the center 12a towards the edge 12b of the substrate 12 at a smaller tilt angle and into the first region 16, the first color filters (22a, 22b, 22c and 22d) and the first hollow members (28a, 28b, 28c and 28d) shift towards the center 12a of the substrate 12 by a smaller distance. When the incident light 37b emits from the center 12a towards the edge 12b of the substrate 12 at a larger tilt angle and into the second region 18, the second color filters (24a, 24b, 24c and 24d) and the second hollow members (30a, 30b, 30c and 30d) shift towards the center 12a of the substrate 12 by a larger distance.

The central color filters (14a, 14b, 14c and 14d), the first color filters (16a, 16b, 16c and 16d) and the second color filters (18a, 18b, 18c and 18d) include red (R) color filters, green (G) color filters or blue (B) color filters. Each of the central hollow member (26a, 26b, 26c and 26d), the first hollow member (28a, 28b, 28c and 28d) and the second hollow member (30a, 30b, 30c and 30d) includes a continuous wall structure 36 enclosing a space 38.

In FIG. 1, a plurality of metal grids 32 are disposed on the substrate 12, and a patterned organic layer 34 is disposed between the central color filters (20a, 20b, 20c and 20d), the first color filters (22a, 22b, 22c and 22d) and the second color filters (24a, 24b, 24c and 24d). Within the central region 14, the patterned organic layer 34 is disposed on the metal grids 32. Within the first region 16, the patterned organic layer 34 is disposed on, for example, a part of the metal grids 32 due to displacement of the first color filters (22a, 22b, 22c and 22d). Within the second region 18, the patterned organic layer 34 is disposed on, for example, more less part of the metal grids 32 due to larger displacement of the second color filters (24a, 24b, 24c and 24d).

The optical device 10 further includes a low-refractive-index material layer 40 covering the central color filters (20a, 20b, 20c and 20d), the first color filters (22a, 22b, 22c and 22d), the second color filters (24a, 24b, 24c and 24d) and the continuous wall structures 36 of the central hollow members (26a, 26b, 26c and 26d), the first hollow members (28a, 28b, 28c and 28d) and the second hollow members (30a, 30b, 30c and 30d), and filled in the spaces 38 of the central hollow members (26a, 26b, 26c and 26d), the first hollow members (28a, 28b, 28c and 28d) and the second hollow members (30a, 30b, 30c and 30d). In some embodiments, the refractive index of the low-refractive-index material layer 40 is in a range from about 1.2 to about 1.5. Specifically, the refractive index of the continuous wall structures 36 of the central hollow members (26a, 26b, 26c and 26d), the first hollow members (28a, 28b, 28c and 28d) and the second hollow members (30a, 30b, 30c and 30d) is greater than the refractive index of the components around the continuous wall structures 36, for example, greater than the refractive index of the low-refractive-index material layer 40, and greater than the refractive index of the central color filters (20a, 20b, 20c and 20d), the first color filters (22a, 22b, 22c and 22d), the second color filters (24a, 24b, 24c and 24d) respectively underneath the continuous wall structures 36 of the central hollow members (26a, 26b, 26c and 26d), the first hollow members (28a, 28b, 28c and 28d) and the second hollow members (30a, 30b, 30c and 30d). In some embodiments, the refractive index of the continuous wall structures 36 of the central hollow members (26a, 26b, 26c and 26d), the first hollow members (28a, 28b, 28c and 28d) and the second hollow members (30a, 30b, 30c and 30d) is in a range from about 1.6 to about 1.9.

Figure 2:
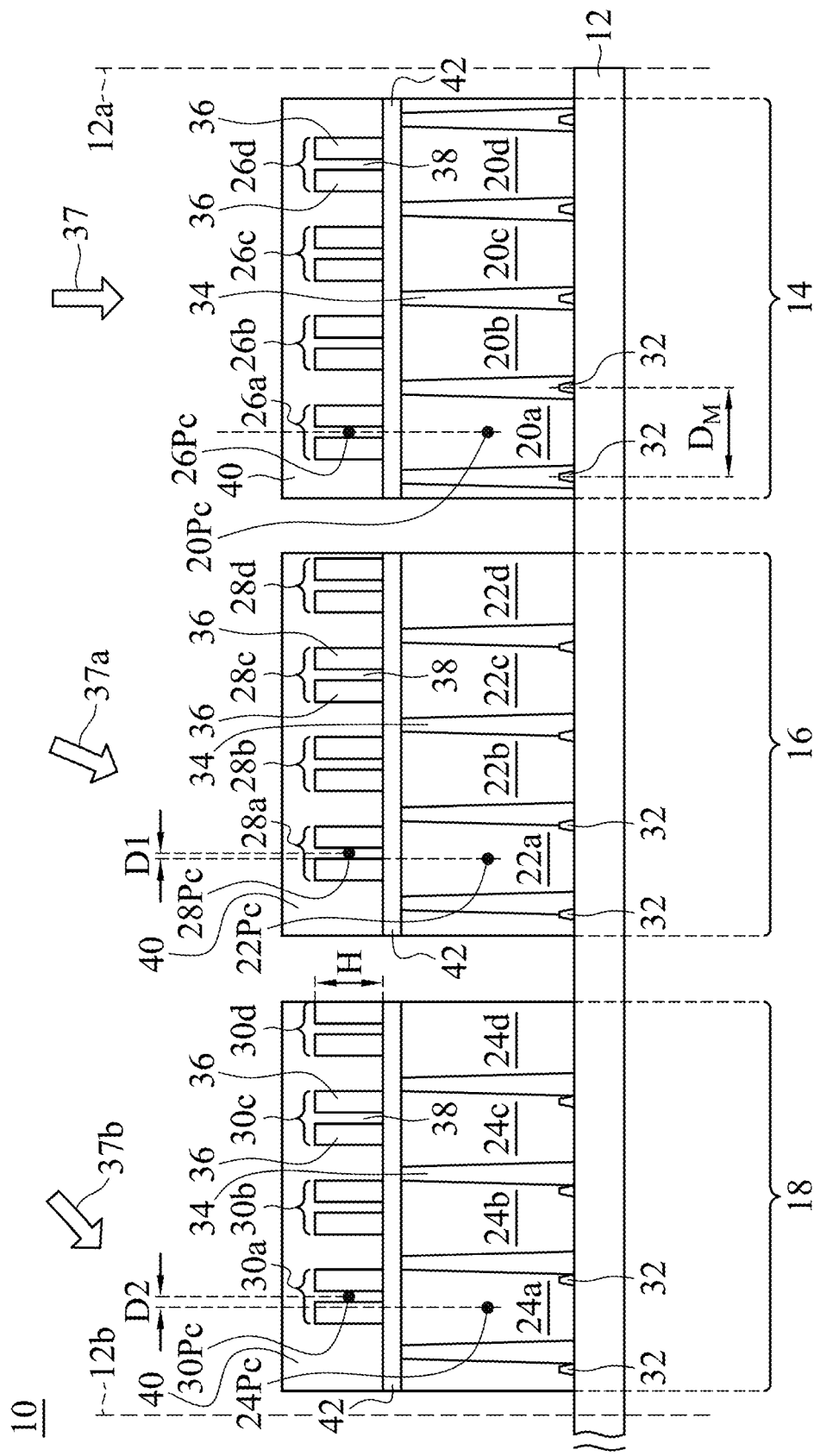
FIG. 2 is a cross-sectional view of an optical device in accordance with one embodiment of the invention.

Referring to FIG. 2, the difference between this embodiment and the embodiment of FIG. 1 is that their structures are different. The following only illustrates the differences, and will not repeat the same parts. In this embodiment, a protection layer 42 is further disposed between the central color filters (20a, 20b, 20c and 20d), the first color filters (22a, 22b, 22c and 22d) and the second color filters (24a, 24b, 24c and 24d) and the central hollow members (26a, 26b, 26c and 26d) the first hollow members (28a, 28b, 28c and 28d) and the second hollow members (30a, 30b, 30c and 30d). In some embodiments, the protection layer 42 is used as an etching stop layer for protecting the central color filters (20a, 20b, 20c and 20d), the first color filters (22a, 22b, 22c and 22d) and the second color filters (24a, 24b, 24c and 24d) from damage during the subsequent etching processes or other processes. In some embodiments, the material of the protection layer 42 is the same as or different from that of the continuous wall structures 36 of the central hollow members (26a, 26b, 26c and 26d), the first hollow members (28a, 28b, 28c and 28d) and the second hollow members (30a, 30b, 30c and 30d). In some embodiments, in accordance with the material of the protection layer 42, an appropriate thickness of the protection layer 42 is selected.

Figure 3:
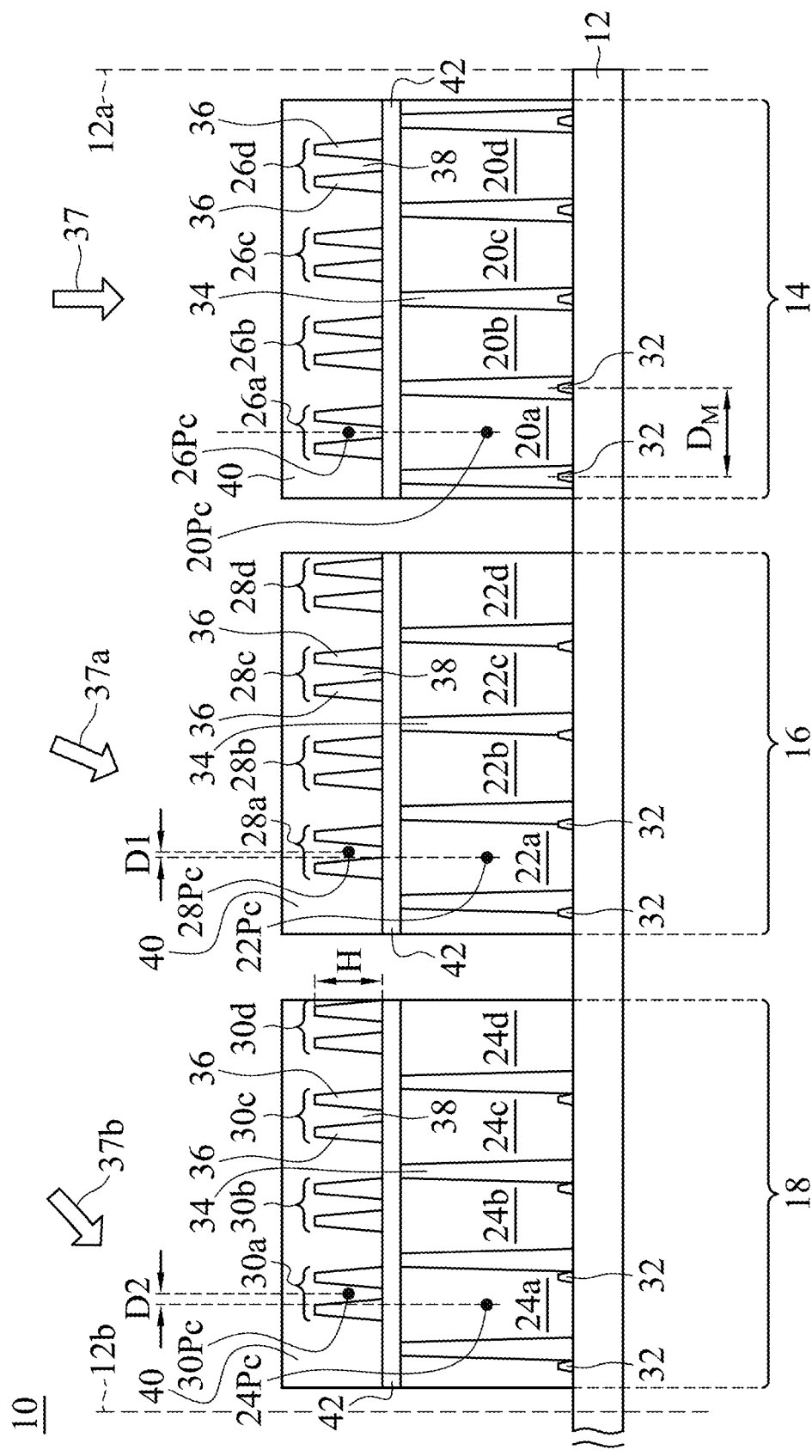
FIG. 3 is a cross-sectional view of an optical device in accordance with one embodiment of the invention.

Referring to FIG. 3, the difference between this embodiment and the embodiment of FIG. 1 is that their structures are different. The following only illustrates the differences, and will not repeat the same parts. In this embodiment, the continuous wall structures 36 of the central hollow members (26a, 26b, 26c and 26d), the first hollow members (28a, 28b, 28c and 28d) and the second hollow members (30a, 30b, 30c and 30d) have a taper cross section. In some embodiments, the continuous wall structures 36 with a taper cross section are formed by an etching process including a forward etching and a lateral etching.

Figure 4:
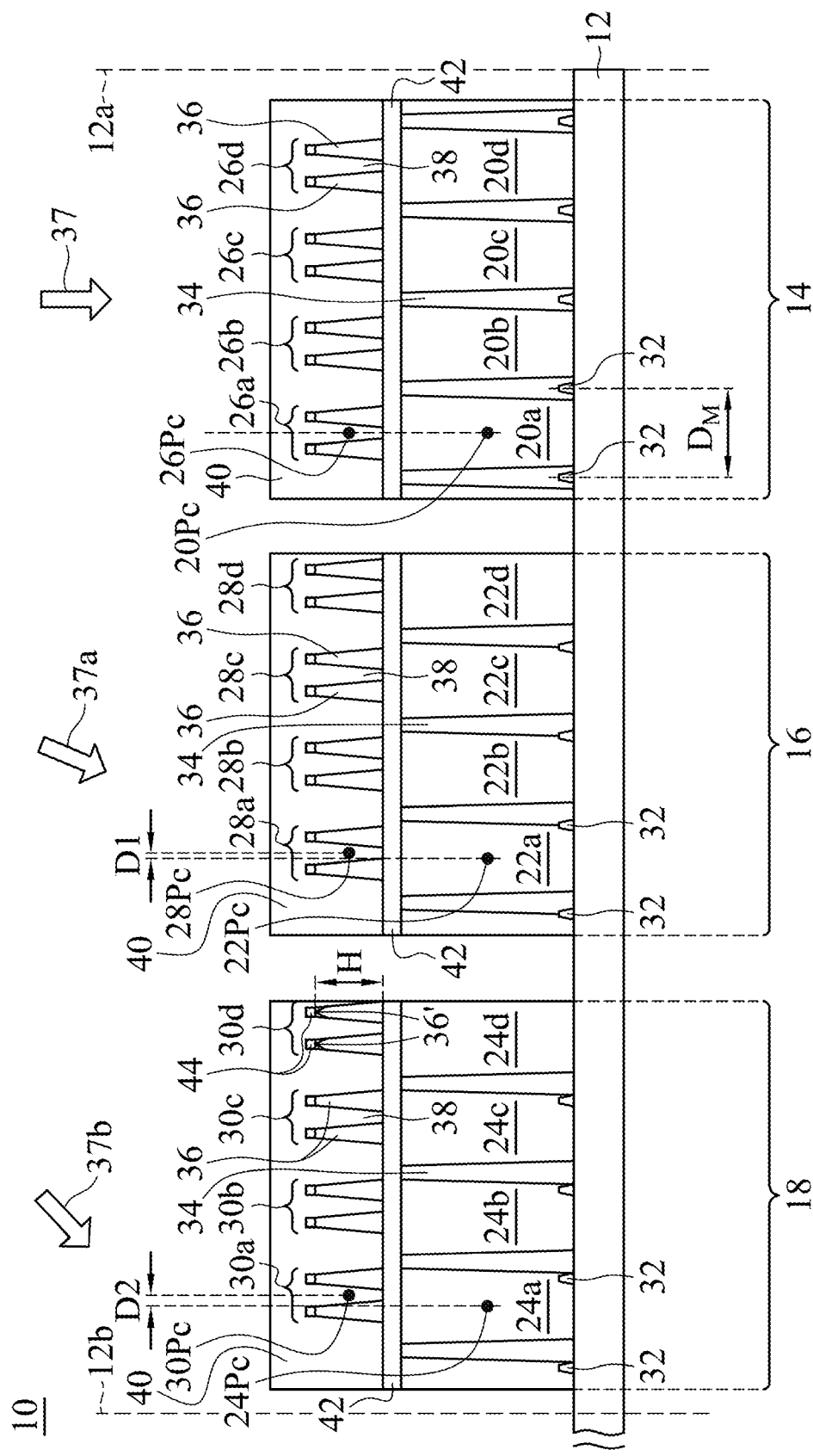
FIG. 4 is a cross-sectional view of an optical device in accordance with one embodiment of the invention.

Referring to FIG. 4, the difference between this embodiment and the embodiment of FIG. 1 is that their structures are different. The following only illustrates the differences, and will not repeat the same parts. In this embodiment, a hard mask layer 44 is further disposed on a top portion 36' of each of the continuous wall structures 36 of the central hollow members (26a, 26b, 26c and 26d), the first hollow members (28a, 28b, 28c and 28d) and the second hollow members (30a, 30b, 30c and 30d). In some embodiments, while the continuous wall structures 36 with high aspect ratio are etched, the hard mask layer 44 with an appropriate thickness is selected for process convenience.

Figure 5:
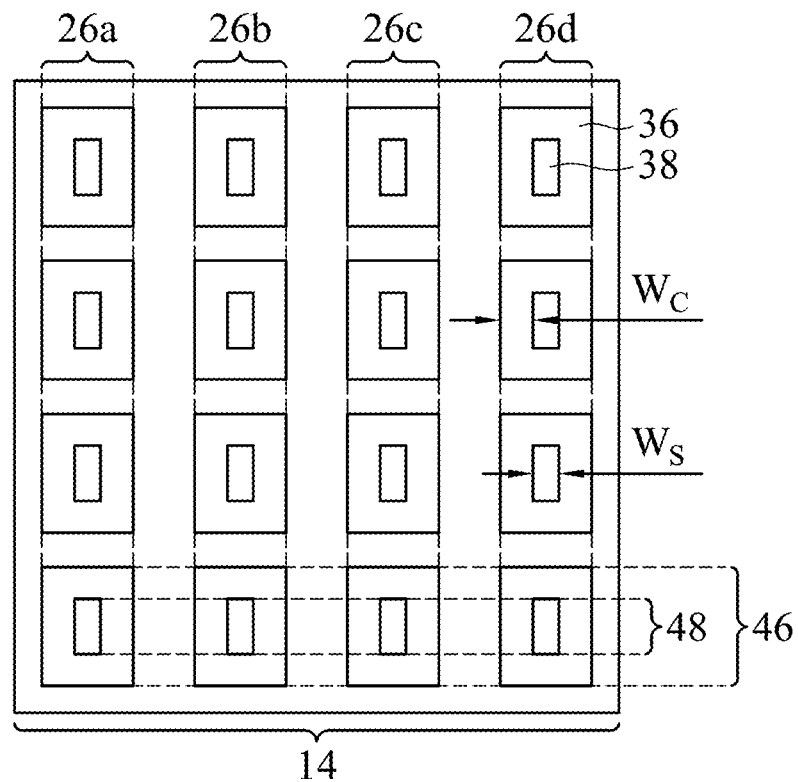
FIG. 5 is a top view of hollow members of an optical device in accordance with one embodiment of the invention.
Figure 6:
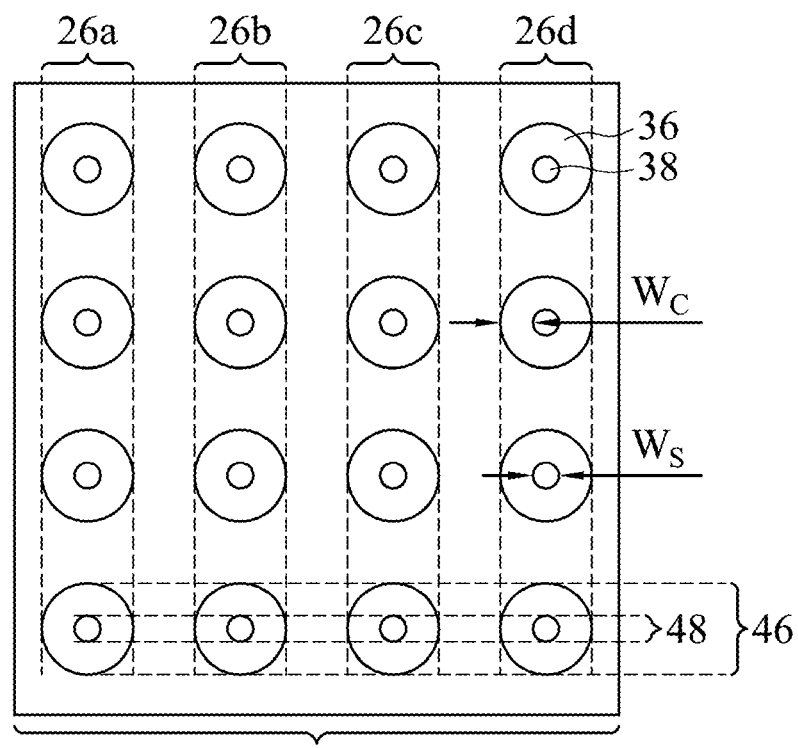
FIG. 6 is a top view of hollow members of an optical device in accordance with one embodiment of the invention.
Figure 7:
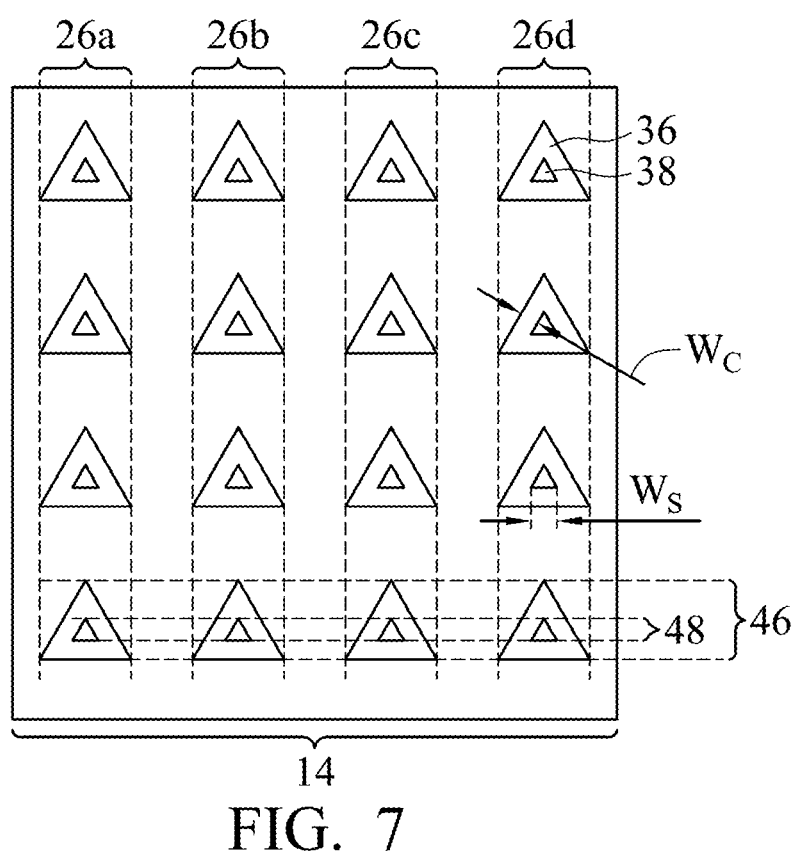
FIG. 7 is a top view of hollow members of an optical device in accordance with one embodiment of the invention.

The shapes and dimensions of the continuous wall structures 36 and the spaces 38 of the central hollow members (26a, 26b, 26c and 26d), the first hollow members (28a, 28b, 28c and 28d) and the second hollow members (30a, 30b, 30c and 30d) are more clearly illustrated as follows. FIGS. 5-7 are top views of a part of these hollow members disposed above the color filters. Here, the central hollow members (26a, 26b, 26c and 26d) within the central region 14 are exemplary. In FIG. 5, the continuous wall structures 36 of the central hollow members (26a, 26b, 26c and 26d) are in a shape of a rectangle. The width "$W_C$" of the continuous wall structure 36 is less than, for example, one-third of a distance "$D_M$" between the adjacent metal grids 32 (see FIG. 1). The height "H" of the continuous wall structure 36 is in a range from about 0.1 μm to about 0.7 μm (see FIG. 1). In addition, the width "$W_S$" of the space 38 is less than, for example, one-third of the distance "$D_M$" between the adjacent metal grids 32 (see FIG. 1). In FIG. 6, the continuous wall structures 36 of the central hollow members (26a, 26b, 26c and 26d) are in a shape of a circle. The width "$W_C$" of the continuous wall structure 36 is less than, for example, one-third of the distance "$D_M$" between the adjacent metal grids 32 (see FIG. 1). The height "H" of the continuous wall structure 36 is in a range from about 0.1 μm to about 0.7 μm (see FIG. 1). In addition, the width (diameter) "$W_S$" of the space 38 is less than, for example, one-third of the distance "$D_M$" between the adjacent metal grids 32 (see FIG. 1). In FIG. 7, the continuous wall structures 36 of the central hollow members (26a, 26b, 26c and 26d) are in a shape of a triangle. The width "$W_C$" of the continuous wall structure 36 is less than, for example, one-third of the distance "$D_M$" between the adjacent metal grids 32 (see FIG. 1). The height "H" of the continuous wall structure 36 is in a range from about 0.1 μm to about 0.7 μm (see FIG. 1). In addition, the width "$W_S$" of the space 38 is less than, for example, one-third of the distance "$D_M$" between the adjacent metal grids 32 (see FIG. 1). In some embodiments, other shapes of the continuous wall structures 36 are also suitable for selection in the present invention, as long as there is a space for filling the low-refractive-index material layer 40 enclosed thereby. In FIGS. 5-7, the continuous wall structures 36 of the central hollow members (26a, 26b, 26c and 26d) constitute a first periodic structure 46. The spaces 38 of the central hollow members (26a, 26b, 26c and 26d) constitute a second periodic structure 48. That is, there are two periodic structures (i.e. the continuous wall structures 36 and the spaces 38) formed in the optical device 10.

In the present invention, there are two periodic structures (i.e. the first periodic structure constituted by the continuous wall structures and the second periodic structure constituted by the spaces filled with the low-refractive-index material layer) formed in the optical device. Since the complicated periodic structures are disposed in the path through which light passes, the surface diffraction in the specific directions (i.e. the zero-order diffraction and the positive and negative first-order diffraction) is thus reduced such that unexpected ghost image and petal flare on the display panel are effectively eliminated. In addition, the hollow waveguide member includes the continuous wall structure with high-refractive-index material and the low-refractive-index material layer enclosed by the continuous wall structure. While the light energy is transmitted through the continuous wall structure with high-refractive-index material, the leaky modes of the adjacent energy waves in the continuous wall structure couple to improve the light energy in the low-refractive-index material layer, effectively increasing the ability to trap the light energy and improving the QE spectrum (R/G/B pixels), for example, within the central region of the substrate.

Example 1

Elimination of Ghost Image and Petal Flare in the Optical Device

Figure 8:
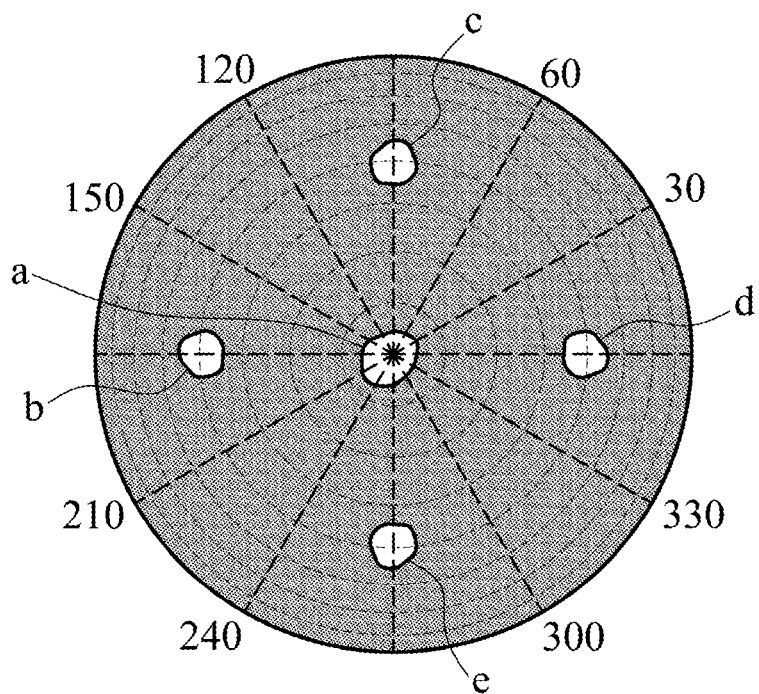
FIG. 8 shows a diffraction simulation image of an optical device.
Figure 9:
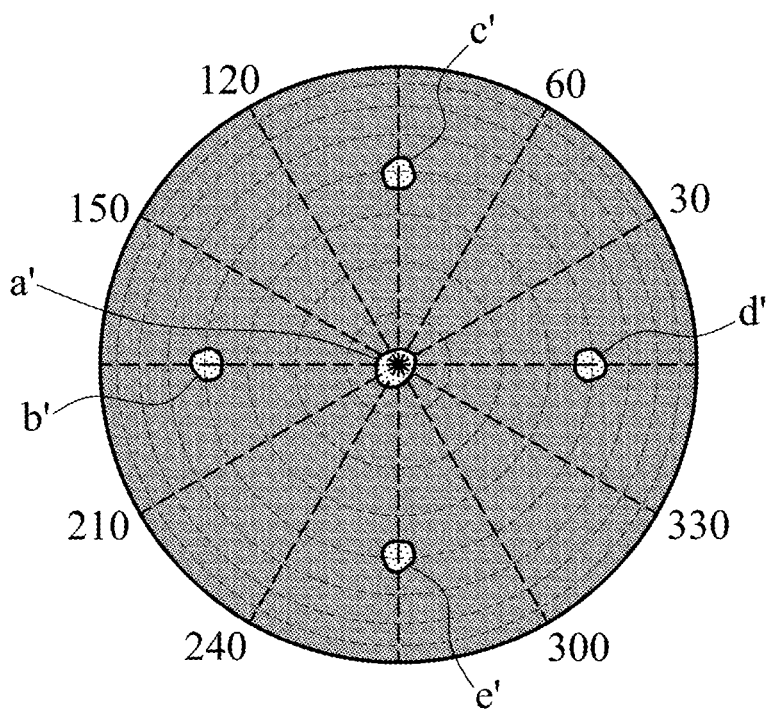
FIG. 9 shows a diffraction simulation image of an optical device in accordance with one embodiment of the invention.

In this example, a conventional image sensor device with solid waveguide members disposed above color filters is provided. The present image sensor device with hollow waveguide members disposed above color filters (as shown in FIG. 1) is also provided. The degree of the surface diffraction (i.e. the zero-order diffraction and the first-order diffraction) of these two image sensor devices is evaluated. The zero-order diffraction forms the ghost image. The first-order diffraction forms petal flare. In the conventional image sensor device, both the zero-order diffraction and the first-order diffraction reach 100% energy so that very obvious ghost image and petal flare appear. The diffraction simulation image of the conventional image sensor device is shown in FIG. 8. In FIG. 8, the light spot a in the central region represents the intensity of the ghost image. The light spots (b, c, d and e) in the peripheral region represent the intensity of the petal flare. In FIG. 8, since the light spots (a, b, c, d and e) located in the central and peripheral regions are very bright, it indicates that there is serious ghost image and petal flare generated by the conventional image sensor device. However, in the present image sensor device, the energy of the zero-order diffraction drops to about 92.1% (about 8% down). Also, the energy of the first-order diffraction drops to about 30.6% (about 70% down) due to the significant decrease in the degree of the surface diffraction caused by the specific hollow waveguide members. The diffraction simulation image of the present image sensor device is also shown in FIG. 9. In FIG. 9, the light spot a' in the central region represents the intensity of the ghost image. The light spots (b', c', d' and e') in the peripheral region represent the intensity of the petal flare. In FIG. 9, since the light spots (a, b, c, d and e) located in the central and peripheral regions are dim, it indicates that there is very slight ghost image and petal flare generated in the present image sensor device. Therefore, in accordance with the diffraction simulation images shown in FIGS. 8 and 9, compared to the conventional image sensor device, in the present image sensor device, the ghost image and petal flare are noticeably improved.

Example 2

QE Spectrum Improvement of the Optical Device

Figure 10:
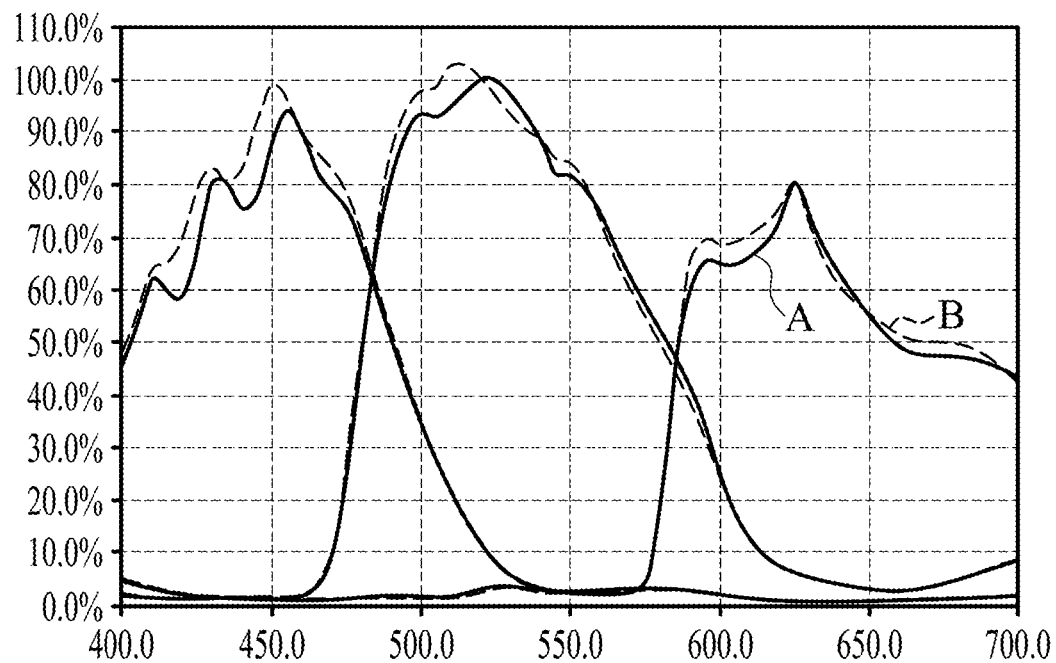
FIG. 10 shows a QE spectrum of an optical device in accordance with one embodiment of the invention.

In this example, a conventional image sensor device with solid waveguide members disposed above color filters is provided. The present image sensor device with hollow waveguide members disposed above color filters (as shown in FIG. 1) is also provided. The QE spectrum (R/G/B pixels) within the central region of the substrate of these two image sensor devices is evaluated. Referring to FIG. 10, the curve "A" shows the QE spectrum (R/G/B pixels) of the conventional image sensor device. The curve "B" shows the QE spectrum (R/G/B pixels) of the present image sensor device. Compared to the QE spectrum (curve "A") built by the conventional image sensor device, in the QE spectrum (curve "B") built by the present image sensor device, the R pixel is raised from 100% to 100.6%, the G pixel is raised from 100% to 102.5%, and the B pixel is raised from 100% to 105.2%.

Example 3

QE Spectrum Maintenance of the Optical Device

Figure 11:
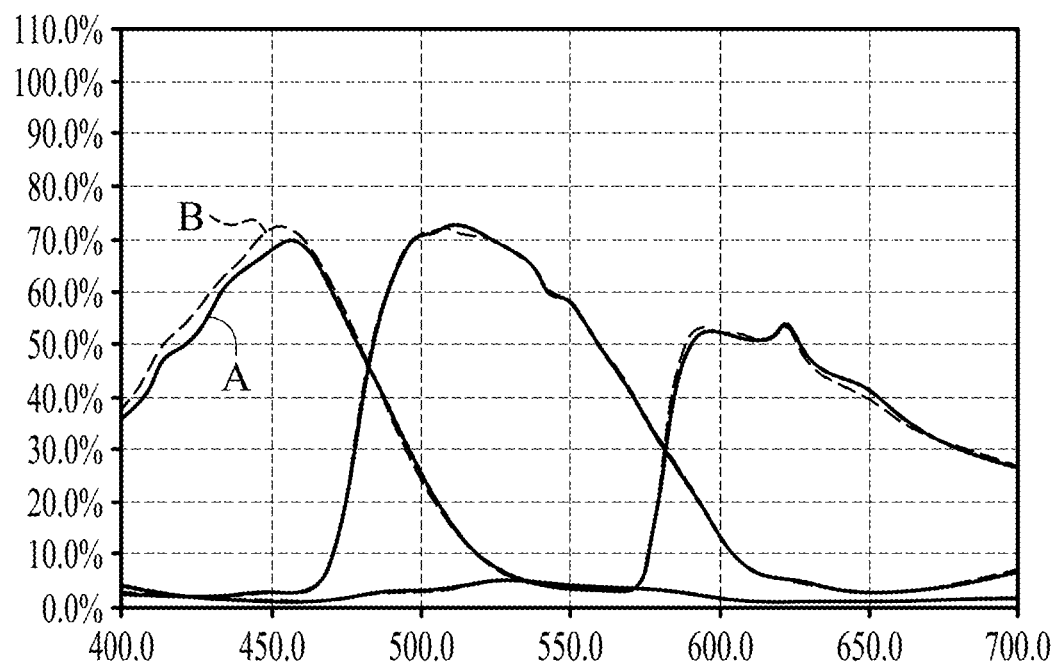
FIG. 11 shows a QE spectrum of an optical device in accordance with one embodiment of the invention.

In this example, a conventional image sensor device with solid waveguide members disposed above color filters is provided. The present image sensor device with hollow waveguide members disposed above color filters (as shown in FIG. 1) is also provided. The QE spectrum (R/G/B pixels) within the edge region of the substrate of these two image sensor devices is evaluated. Referring to FIG. 11, the curve "A" shows the QE spectrum (R/G/B pixels) of the conventional image sensor device. The curve "B" shows the QE spectrum (R/G/B pixels) of the present image sensor device. Compared to the QE spectrum (curve "A") built by the conventional image sensor device, in the QE spectrum (curve "B") built by the present image sensor device, the R/G/B pixels maintain comparable QE and crosstalk phenomena.

Example 4

Channel Difference Maintenance of the Optical Device

In this example, a conventional image sensor device with solid waveguide members disposed above color filters is provided. The present image sensor device with hollow waveguide members disposed above color filters (as shown in FIG. 1) is also provided. The channel difference (R/G/B pixels) within the edge region of the substrate of these two image sensor devices is evaluated. The channel difference is defined as the difference between the maximum sensitivity and the minimum sensitivity in a pixel. In the conventional image sensor device, the channel difference of the Gr pixel (the G pixel adjacent to the R pixel) is 1.6%, the Gb pixel (the G pixel adjacent to the B pixel) is 2.0%, the R pixel is 4.2% and the B pixel is 1.5%. In the present image sensor device, the channel difference of the Or pixel (the G pixel adjacent to the R pixel) is 2.9%, the Gb pixel (the G pixel adjacent to the B pixel) is 2.1%, the R pixel is 3.9% and the B pixel is 1.4%. According to the evaluation results, compared to the conventional image sensor device, in the present image sensor device, the Gr/Gb/RIB pixels maintain comparable channel difference.

Example 5

Improvement of the Ability to Trap Light Energy in the Optical Device

Figure 12:
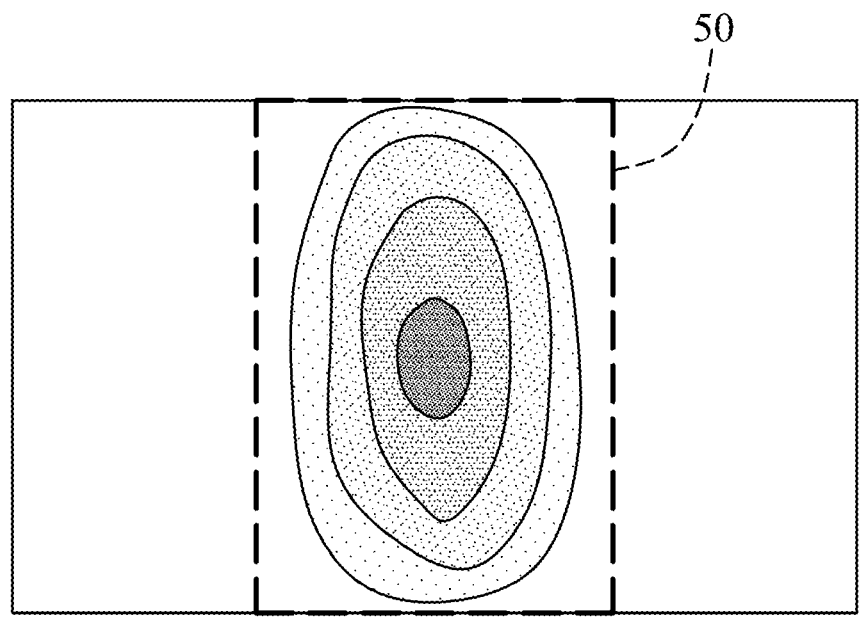
FIG. 12 shows a light energy distribution profile of a conventional optical device.
Figure 13:
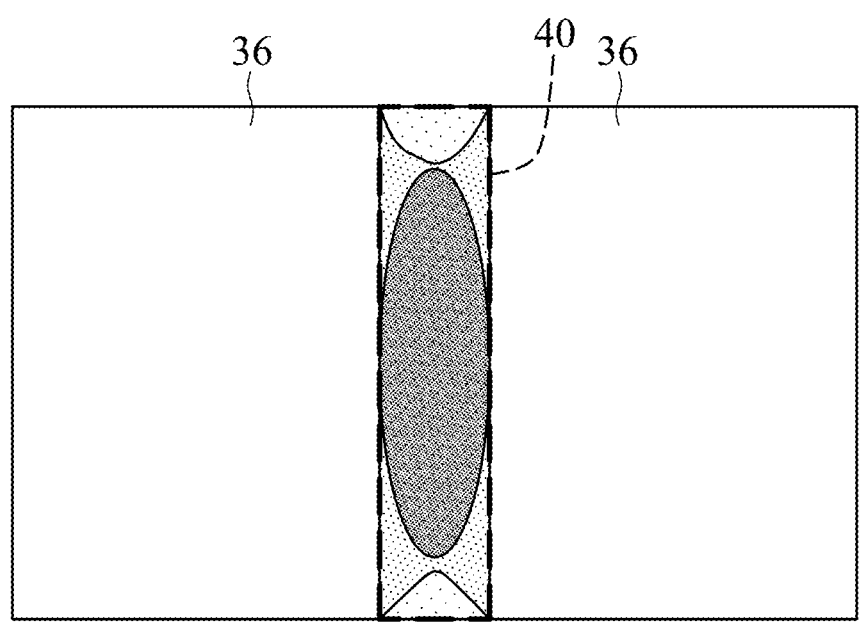
FIG. 13 shows a light energy distribution profile of an optical device in accordance with one embodiment of the invention.

In this example, a conventional image sensor device with solid waveguide members disposed above color filters is provided. The present image sensor device with hollow waveguide members disposed above color filters (as shown in FIG. 1) is also provided. The ability to trap light energy in the waveguide members of these two image sensor devices is evaluated. FIG. 12 shows a light energy distribution profile in the solid waveguide member 50 (with high-refractive-index material) of the conventional optical device. FIG. 13 shows a light energy distribution profile in the hollow waveguide member (constituted by the continuous wall structure 36 (with high-refractive-index material) enclosing the low-refractive-index material layer 40) of the present optical device. According to FIG. 12, only a part of the light energy is trapped in the solid waveguide member 50 with high-refractive-index material, and the remaining light energy spreads outward. However, according to FIG. 13, most of the light energy is trapped in the low-refractive-index material layer 40 enclosed by the continuous wall structure 36, and almost no light energy spreads out. In the present optical device, while the light energy is transmitted through the continuous wall structure 36 with high-refractive-index material, due to an appropriate dimension of the low-refractive-index material layer 40, the leaky modes of the adjacent energy waves in the continuous wall structure 36 couple to cause a significant increase in the light energy in the low-refractive-index material layer 40. Therefore, the ability to trap the light energy is improved by the specific hollow waveguide members disposed in the present optical device.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical device, comprising:
a substrate having a center and an edge;
a central color filter, a first color filter and a second color filter sequentially disposed on the substrate from the center to the edge of the substrate; and
a central hollow member, a first hollow member and a second hollow member respectively disposed on the central color filter, the first color filter and the second color filter,
wherein there is no distance between a center of the central color filter and a center of the central hollow member, there is a first distance between a center of the first color filter and a center of the first hollow member, there is a second distance between a center of the second color filter and a center of the second hollow member, the first distance is greater than zero, and the second distance is greater than the first distance.

2. The optical device as claimed in claim 1, wherein each of the central hollow member, the first hollow member and the second hollow member comprises a continuous wall structure enclosing a space.

3. The optical device as claimed in claim 2, wherein the continuous wall structure has a taper cross section.

4. The optical device as claimed in claim 2, wherein the continuous wall structure is in a shape of a rectangle, a circle or a triangle.

5. The optical device as claimed in claim 4, further comprising a plurality of metal grids disposed on the substrate.

6. The optical device as claimed in claim 5, wherein the continuous wall structure has a width which is less than one-third of a distance between the adjacent metal grids.

7. The optical device as claimed in claim 2, wherein the continuous wall structure has a height which is in a range from about 0.1 µm to about 0.7 µm.

8. The optical device as claimed in claim 5, wherein the space has a width which is less than one-third of a distance between the adjacent metal grids, while the continuous wall structure is in a shape of a rectangle.

9. The optical device as claimed in claim 5, wherein the space has a diameter which is less than one-third of a distance between the adjacent metal grids, while the continuous wall structure is in a shape of a circle.

10. The optical device as claimed in claim 2, further comprising a low-refractive-index material layer covering the central color filter, the first color filter, the second color filter and the continuous wall structures of the central hollow member, the first hollow member and the second hollow member, and filled in the spaces of the central hollow member, the first hollow member and the second hollow member.

11. The optical device as claimed in claim 10, wherein the low-refractive-index material layer has a refractive index which is in a range from about 1.2 to about 1.5.

12. The optical device as claimed in claim 10, wherein the continuous wall structures of the central hollow member, the first hollow member and the second hollow member have a refractive index which is greater than that of the low-refractive-index material layer, and greater than those of the central color filter, the first color filter and the second color filter respectively underneath the continuous wall structures of the central hollow member, the first hollow member and the second hollow member.

13. The optical device as claimed in claim 12, wherein the refractive index of the continuous wall structures of the central hollow member, the first hollow member and the second hollow member is in a range from about 1.6 to about 1.9.

14. The optical device as claimed in claim 1, further comprising a protection layer disposed between the central color filter, the first color filter and the second color filter and the central hollow member, the first hollow member and the second hollow member.

15. The optical device as claimed in claim 2, further comprising a hard mask layer disposed on top of the continuous wall structures of the central hollow member, the first hollow member and the second hollow member.

16. The optical device as claimed in claim 2, wherein the substrate comprises a central region, a first region and a second region sequentially from the center to the edge of the substrate.

17. The optical device as claimed in claim 16, wherein there are a plurality of the central color filters configured with the central hollow members within the central region, there are a plurality of the first color filters configured with the first hollow members within the first region, and there are a plurality of the second color filters configured with the second hollow members within the second region.

18. The optical device as claimed in claim 17, wherein the continuous wall structures of the central hollow members, the first hollow members and the second hollow members constitute a first periodic structure.

19. The optical device as claimed in claim 18, wherein the spaces of the central hollow members, the first hollow members and the second hollow members constitute a second periodic structure.

* * * * *